US011476816B2

(12) United States Patent
Lie et al.

(10) Patent No.: US 11,476,816 B2
(45) Date of Patent: Oct. 18, 2022

(54) AMPLIFIER DEVICE AND DUPLEXER CIRCUIT

(71) Applicant: RichWave Technology Corp., Taipei (TW)

(72) Inventors: Yu-Chun Donald Lie, Taipei (TW); Chuan-Chen Chao, Taipei (TW)

(73) Assignee: RichWave Technology Corp., Taipei (TW)

( * ) Notice: Subject to any disclaimer, the term of this patent is extended or adjusted under 35 U.S.C. 154(b) by 148 days.

(21) Appl. No.: 17/128,212

(22) Filed: Dec. 21, 2020

(65) Prior Publication Data

US 2022/0116000 A1    Apr. 14, 2022

(30) Foreign Application Priority Data

Oct. 14, 2020 (TW) ................. 109135581

(51) Int. Cl.
  *H03F 3/45*    (2006.01)
  *H03F 3/195*   (2006.01)
  *H04B 1/04*    (2006.01)

(52) U.S. Cl.
  CPC ......... *H03F 3/45179* (2013.01); *H03F 3/195* (2013.01); *H04B 1/0458* (2013.01); *H03F 2200/294* (2013.01); *H03F 2200/451* (2013.01); *H03F 2203/45544* (2013.01); *H04B 2001/0408* (2013.01)

(58) Field of Classification Search
  CPC ........................................................ H03F 3/45
  USPC .................................................. 330/253, 254
  See application file for complete search history.

(56) References Cited

U.S. PATENT DOCUMENTS

| 7,256,646 | B2* | 8/2007 | Eid ........................... H03F 1/26 327/563 |
| 8,461,926 | B2* | 6/2013 | Mineyama ................ H03F 1/56 330/253 |
| 9,419,564 | B2* | 8/2016 | Tajalli ................... H03F 1/0205 |
| 9,490,759 | B2* | 11/2016 | Samavedam ........... H03F 3/245 |
| 2006/0284670 | A1 | 12/2006 | Eid et al. |
| 2012/0139632 | A1 | 6/2012 | Mineyama et al. |
| 2015/0288334 | A1 | 10/2015 | Cai et al. |

(Continued)

OTHER PUBLICATIONS

Office Action of Taiwan Counterpart Application, dated Dec. 29, 2021, pp. 1-4.

*Primary Examiner* — Henry Choe
(74) *Attorney, Agent, or Firm* — JCIPRNET (57) ABSTRACT

An amplifier device and a duplexer circuit are provided. The amplifier device includes a first differential amplifier circuit and a controller. The first differential amplifier circuit includes first and second radio frequency (RF) input terminals, first and second transistors, first and second adjustable capacitor circuits, and first and second RF output terminals. The controller adjusts capacitance values of the first adjustable capacitor circuit of the first differential amplifier circuit and the second adjustable capacitor circuit of the first differential amplifier circuit according to at least one of a characteristic related to a first RF input signal of the first differential amplifier circuit, a characteristic related to the second RF input signal of the first differential amplifier circuit, a matching deviation between the first transistor and the second transistor of the first differential amplifier circuit, and a characteristic of the amplifier device.

20 Claims, 5 Drawing Sheets

(56) References Cited

U.S. PATENT DOCUMENTS

2015/0349721 A1 12/2015 Samavedam et al.
2016/0072449 A1 3/2016 Tajalli

* cited by examiner

AMPLIFIER DEVICE AND DUPLEXER CIRCUIT

CROSS-REFERENCE TO RELATED APPLICATION

This application claims the priority benefit of Taiwan application serial no. 109135581, filed on Oct. 14, 2020. The entirety of the above-mentioned patent application is hereby incorporated by reference herein and made a part of this specification.

BACKGROUND

Field of the Disclosure

The disclosure relates to a circuit structure of a wireless communication system, and particularly relates to an amplifier device and a multiplexer circuit.

Description of Related Art

Nowadays, wireless communication equipment with dual-terminal/differential antennas is increasing day by day. Therefore, research and practices concerning radio frequency amplifier devices matching with dual-terminal/differential antennas haven been carried out. However, since there are problems such as matching deviation between the transistor differential pair and the loss of signal power occurred to the radio frequency amplifier with the dual-terminal/differential circuit topology structure, it stills requires more research in the wireless communication field to find out how to mitigate the above-mentioned problems.

SUMMARY OF THE DISCLOSURE

An amplifier device of the disclosure includes a first differential amplifier circuit and a controller. The first differential amplifier circuit includes first and second radio frequency input terminals, first and second transistors, first and second adjustable capacitor circuits, and first and second radio frequency output terminals. The first radio frequency input terminal is configured for inputting a first radio frequency input signal. The second radio frequency input terminal is configured for inputting a second radio frequency input signal. The first transistor has a first terminal and a control terminal coupled to the first radio frequency input terminal, wherein the control terminal obtains the first radio frequency input signal through the first radio frequency input terminal, and the first transistor amplifies the first radio frequency input signal and generates a first amplified radio frequency signal at the first terminal. The second transistor has a first terminal and a control terminal coupled to the second radio frequency input terminal, wherein the control terminal obtains the second radio frequency input signal through the second radio frequency input terminal, and the second transistor amplifies the second radio frequency input signal and generates a second amplified radio frequency signal at the first terminal. The first adjustable capacitor circuit is coupled between the control terminal of the first transistor and the first terminal of the second transistor for coupling the first radio frequency input signal to the first terminal of the second transistor. The second adjustable capacitor circuit is coupled between the control terminal of the second transistor and the first terminal of the first transistor for coupling the second radio frequency input signal to the first terminal of the first transistor. The first radio frequency output terminal is coupled to the first terminal of the first transistor for outputting a first radio frequency output signal. The second radio frequency output terminal is coupled to the first terminal of the second transistor for outputting a second radio frequency output signal. The first amplified radio frequency signal is combined with the coupled second radio frequency input signal to form the first radio frequency output signal, and the second amplified radio frequency signal is combined with the coupled first radio frequency input signal to form the second radio frequency output signal. The controller is coupled to the first adjustable capacitor circuit of the first differential amplifier circuit and the second adjustable capacitor circuit of the first differential amplifier circuit, and configured to adjust capacitance values of the first adjustable capacitor circuit of the first differential amplifier circuit and the second adjustable capacitor circuit of the first differential amplifier circuit according to at least one of a characteristic related to a first radio frequency input signal of the first differential amplifier circuit, a characteristic related to the second radio frequency input signal of the first differential amplifier circuit, a matching deviation between the first transistor and the second transistor of the first differential amplifier circuit, and a characteristic of the amplifier device.

An amplifier device of the disclosure includes a first differential amplifier circuit. The first differential amplifier circuit includes a first radio frequency input terminal, a second radio frequency input terminal, a first transistor, a second transistor, a first adjustable capacitor circuit, and a second adjustable capacitor circuit. The first radio frequency input terminal is configured for inputting a first radio frequency input signal. The second radio frequency input terminal is configured for inputting a second radio frequency input signal. The control terminal of the first transistor obtains the first radio frequency input signal through the first radio frequency input terminal, the first transistor amplifies the first radio frequency input signal and generates a first amplified radio frequency signal at the first terminal of the first transistor. The control terminal of the second transistor obtains the second radio frequency input signal through the second radio frequency input terminal, and the second transistor amplifies the second radio frequency input signal and generates a second amplified radio frequency signal at the first terminal of the second transistor. The first terminal of the first adjustable capacitor circuit is coupled to the control terminal of the first transistor for receiving a first voltage, and the second terminal of the first adjustable capacitor circuit is coupled to the first terminal of the second transistor for receiving a second voltage. The first adjustable capacitor circuit is configured for coupling the first radio frequency input signal to the first terminal of the second transistor. The capacitance value of the first adjustable capacitor circuit is controlled by the first voltage and the second voltage. The first terminal of the second adjustable capacitor circuit is coupled to the control terminal of the second transistor for receiving a third voltage, and the second terminal of the second adjustable capacitor circuit is coupled to the first terminal of the first transistor for receiving a fourth voltage. The second adjustable capacitor circuit is configured to couple the second radio frequency input signal to the first terminal of the first transistor, and the capacitance value of the second adjustable capacitor circuit is controlled by the third voltage and the fourth voltage. The first amplified radio frequency signal is combined with the coupled second radio frequency input signal to form a first radio frequency output signal, and the second amplified radio frequency signal is combined with the coupled first radio frequency input signal to form a second radio frequency output signal. The first voltage is related to the first radio frequency input signal, the second voltage is related to the second radio frequency output signal, the third voltage is related to the second radio frequency input signal, and the fourth voltage is related to the first radio frequency output signal.

A duplexer circuit of the disclosure is coupled to an antenna. The duplexer circuit includes a duplexer, a power amplifier, a low noise amplifier, and an amplifier device. The duplexer includes an antenna terminal, a signal transmitting terminal, and a signal receiving terminal. The power amplifier is coupled to the signal receiving terminal of the duplexer. The low noise amplifier is coupled to the signal transmitting terminal of the duplexer. The amplifier device is configured in the power amplifier or the low noise amplifier. The amplifier device includes a first differential amplifier circuit. The first differential amplifier circuit includes a first radio frequency input terminal, a second radio frequency input terminal, a first transistor, a second transistor, a first adjustable capacitor circuit, and a second adjustable capacitor circuit. The first radio frequency input terminal is configured for inputting a first radio frequency input signal. The second radio frequency input terminal is configured for inputting a second radio frequency input signal. The first transistor has a first terminal and a control terminal coupled to the first radio frequency input terminal, wherein the control terminal obtains the first radio frequency input signal through the first radio frequency input terminal, and the first transistor amplifies the first radio frequency input signal and generates a first amplified radio frequency signal at the first terminal. The second transistor has a first terminal and a control terminal coupled to the second radio frequency input terminal, wherein the control terminal obtains the second radio frequency input signal through the second radio frequency input terminal, and the second transistor amplifies the second radio frequency input signal and generates a second amplified radio frequency signal at the first terminal. The first adjustable capacitor circuit is coupled between the control terminal of the first transistor and the first terminal of the second transistor, for coupling the first radio frequency input signal to the first terminal of the second transistor. The second adjustable capacitor circuit is coupled between the control terminal of the second transistor and the first terminal of the first transistor, for coupling the second radio frequency input signal to the first terminal of the first transistor. The first radio frequency output terminal is coupled to the first terminal of the first transistor, for outputting a first radio frequency output signal. The second radio frequency output terminal is coupled to the first terminal of the second transistor, for outputting a second radio frequency output signal. The first amplified radio frequency signal is combined with the coupled second radio frequency input signal to form the first radio frequency output signal, and the second amplified radio frequency signal is combined with the coupled first radio frequency input signal to form the second radio frequency output signal. The controller is coupled to the first adjustable capacitor circuit of the first differential amplifier circuit and the second adjustable capacitor circuit of the first differential amplifier circuit, and is configured to adjust capacitance values of the first adjustable capacitor circuit of the first differential amplifier circuit and the second adjustable capacitor circuit of the first differential amplifier circuit according to at least one of a characteristic related to a first radio frequency input signal of the first differential amplifier circuit, a characteristic related to the second radio frequency input signal of the first differential amplifier circuit, a matching deviation between the first transistor and the second transistor of the first differential amplifier circuit, and a characteristic of the amplifier device.

DESCRIPTION OF EMBODIMENTS

Figure 1:
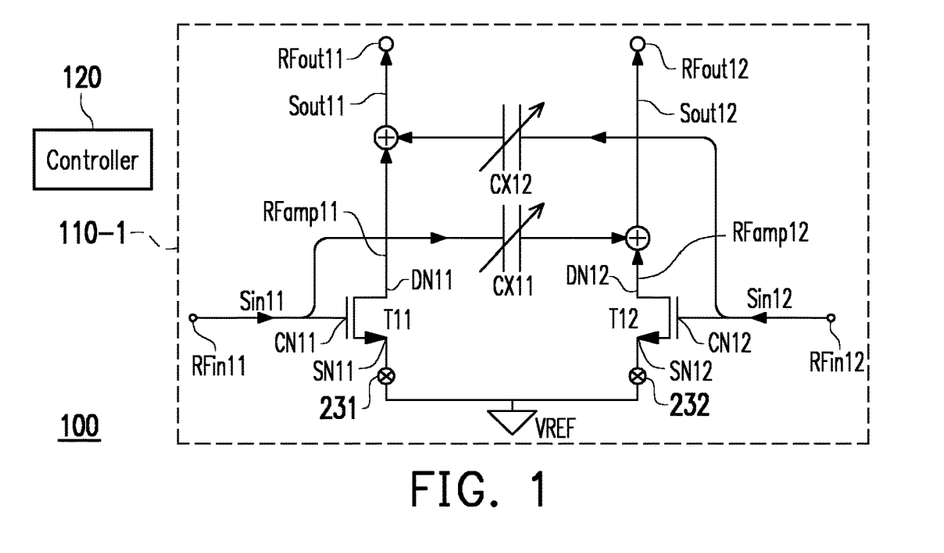
FIG. 1 is a circuit diagram of an amplifier device according to a first embodiment of the disclosure.

FIG. 1 is a circuit diagram of an amplifier device 100 according to a first embodiment of the disclosure. The amplifier device 100 of this embodiment could be applied to a duplexer circuit of a wireless communication system. The amplifier device 100 may be used as a low noise amplifier (LNA) for receiving antenna signals in a duplexer circuit. The amplifier device 100 may also be used as a power amplifier (PA) for transmitting antenna signals in a duplexer circuit. By applying this embodiment, the amplifier device 100 could also be applied to amplifier circuits in other technical fields depending on the needs.

The amplifier device 100 includes a differential amplifier circuit 110-1 and a controller 120. The differential amplifier circuit 110-1 includes radio frequency input terminals RFin11 and RFin12, transistors T11 and T12, adjustable capacitor circuits CX11 and CX12, and radio frequency output terminals RFout11 and RFout12. The radio frequency input terminal RFin11 is configured to input the radio frequency input signal Sin11, and the radio frequency input terminal RFin12 is configured to input the radio frequency input signal Sin12. The differential amplifier circuit 110-1 of this embodiment could also be referred to as a first-stage differential amplifier circuit.

The transistor T11 has a first terminal DN11 (for example, the drain terminal of the transistor T11) and a control terminal CN11 (for example, the gate terminal of the transistor T11). The control terminal CN11 is coupled to the radio frequency input terminal RFin11. The control terminal CN11 obtains the radio frequency input signal Sin11 through the radio frequency input terminal RFin11. The transistor T11 amplifies the radio frequency input signal Sin11 and generates an amplified radio frequency signal RFamp11 at its first terminal DN11. The transistor T12 has a first terminal DN12 (for example, the drain terminal of the transistor T12) and a control terminal CN12 (for example, the gate terminal of the transistor T12). The control terminal CN12 is coupled to the radio frequency input terminal RFin12. The control terminal CN12 obtains the radio frequency input signal Sin12 through the radio frequency input terminal RFin12.

The transistor T12 amplifies the radio frequency input signal Sin12 and generates an amplified radio frequency signal RFamp12 at its first terminal DN12.

The adjustable capacitor circuit CX11 is coupled between the control terminal CN11 of the transistor T11 and the first terminal DN12 of the transistor T12 for coupling the radio frequency input signal Sin11 to the first terminal DN12 of the transistor T12. The adjustable capacitor circuit CX12 is coupled between the control terminal CN12 of the transistor T12 and the first terminal DN11 of the transistor T11 for coupling the radio frequency input signal Sin12 to the first terminal DN11 of the transistor T11. The radio frequency output terminal RFout11 is coupled to the first terminal DN11 of the transistor T11 for outputting the radio frequency output signal Sout11. The radio frequency output terminal RFout12 is coupled to the first terminal DN12 of the transistor T12 for outputting the radio frequency output signal Sout12. The amplified radio frequency signal RFamp11 is combined with the coupled radio frequency input signal Sin12 to form the radio frequency output signal Sout11, and the amplified radio frequency signal RFamp12 is combined with the coupled radio frequency input signal Sin11 to form the radio frequency output signal Sout12.

In the differential amplifier circuit 110-1 of this embodiment, the radio frequency input signals Sin11 and Sin12 are inverse to each other, the radio frequency input signal Sin11 and the amplified radio frequency signal RFamp11 are inverse to each other, and the radio frequency input signal Sin12 and the amplified radio frequency signal RFamp12 are inverse to each other.

The amplifier device 100 is configured to input an input signal Sin and output an output signal Sout. The radio frequency input signals Sin11 and Sin12 are generated by the input signal Sin, and the output signal Sout is generated by the radio frequency output signals Sout11 and Sout12. In other words, the amplifier device 100 is a differential amplifier circuit, and its input signal Sin is divided into two input signals Sin11 and Sin12, and the output signal Sout is also composed of two radio frequency output signals Sout11 and Sout12.

The adjustable capacitor circuits CX11 and CX12 are mainly configured to at least partially offset the parasitic capacitance between the control terminal CN11 and the first terminal DN11 of the transistor T11, and at least partially offset the parasitic capacitance between the control terminal CN12 and first terminal DN12 of the transistor T12. In this manner, by reducing/offsetting the parasitic capacitance between the control terminal and the first terminal of the transistors T11 and T12, it is possible to improve the power gain and gain linearity (for example, the second-order intercept point (IIP2), third-order intercept point (IIP3), error vector magnitude (EVM), adjacent channel leakage ratio (ACLR), etc.) of the differential amplifier circuit 110-1, as well as the matching deviation of the balanced differential pair in the semiconductor process . . . etc.

The controller 120 in this embodiment is coupled to the adjustable capacitor circuit CX11 of the differential amplifier circuit 110-1 and the adjustable capacitor circuit CX12 of the differential amplifier circuit 110-1. The controller 120 adjusts the capacitance value of the adjustable capacitor circuit CX11 and the capacitance value of the adjustable capacitor circuit CX12 of the differential amplifier circuit 110-1 according to at least one of the characteristic related to the radio frequency input signal Sin11 of the differential amplifier circuit 110-1, the characteristic related to the radio frequency input signal Sin12 of the differential amplifier circuit 110-1, the matching deviation between the transistors T11 and T12 of the differential amplifier circuit 110-1, and the characteristic of the amplifier device 100.

For example, the characteristic of the amplifier device 100 may include the signal amplification linearity of the amplifier device 100. In detail, the controller 120 could adjust the capacitance values of the adjustable capacitor circuits CX11 and CX12 according to the second-order intercept point (IIP2) related to the signal amplification linearity of the amplifier device 100. The characteristic of the amplifier device 100 may also include the operating current of the amplifier device 100 in current operation as well as the current power gain of the amplifier device 100.

For example, the characteristic related to the radio frequency input signal Sin11 may be: the frequency of the radio frequency input signal Sin11, the frequency of the radio frequency output signal Sout11, the power of the radio frequency input signal Sin11, or the power of the radio frequency output signal Sout111. The characteristic related to the radio frequency input signal Sin12 may be: the frequency of the radio frequency input signal Sin12, the frequency of the radio frequency output signal Sout12, the power of the radio frequency input signal Sin12, or the power of the radio frequency output signal Sout12.

The controller in various embodiments of the disclosure could be additionally coupled to appropriate detection circuits such as process error detection circuit, current detection circuit, power detection circuit, frequency detection circuit, etc., so as to obtain the characteristics related to various radio frequency signals and/or characteristic parameters such as matching deviation in various embodiments of the disclosure to be used as a basis for adjusting the capacitance value of various adjustable capacitor circuits.

In this embodiment, the controller 120 could adjust the capacitance value in the adjustable capacitor circuit CX11 or CX12 in a variety of ways. For example, the controller 120 could use a look-up table to find the corresponding capacitance value in the adjustable capacitor circuit CX11 or CX12 in the lookup table according to the one or more characteristics mentioned above (e.g., at least one of the characteristic related to the radio frequency input signal Sin11 of the differential amplifier circuit 110-1, the characteristic related to the radio frequency input signal Sin12 of the differential amplifier circuit 110-1, the matching deviation between the transistors T11 and T12 of the differential amplifier circuit 110-1, and the characteristic of the amplifier device 100 or a combination thereof) as input, and adjust the capacitance value in the adjustable capacitor circuit CX11 or CX12 by means of digital control or analog control. In this embodiment, the adjustable capacitor circuits CX11 and CX12 could be adjusted through circuit design, and the power gain of the amplifier circuit 100 hence could be improved. However, since the capacitance values of the parasitic capacitors in the amplifier circuit 100 are not necessarily linear, and the parasitic capacitance values might be different under different circumstances, the embodiment is designed to utilize the controller 120 or other manners to adaptively adjust the capacitance values of the adjustable capacitor circuits CX11 and CX12 according to one or more characteristics mentioned above, thereby improving the functions of the amplifier circuit 100, such as increasing power gain, enhancing gain linearity, balancing the matching deviation of the differential pair, etc.

The second terminal SN11 of the transistor T11 (for example, the source terminal of the transistor T11) and the second terminal SN12 of the transistor T12 (for example, the source terminal of the transistor T12) are coupled to the reference voltage terminal VREF. The reference voltage terminal VREF in this embodiment could be a common terminal or a ground terminal. Those who apply this embodiment could adjust the voltage value of this reference voltage terminal according to the needs.

In this embodiment, various elements in the amplifier device 100 may be made of group III-V compound as material, such as, gallium arsenide (GaAs) or gallium nitride (GaN). In addition, the amplifier device 100 is manufactured through a high electron mobility transistor (HEMT) process. Those applying this embodiment could use other materials to manufacture the elements of the amplifier device 100 according to the requirements and current technology, for example, by using silicon elements and corresponding semiconductor process to manufacture the amplifier device 100.

Figure 2:
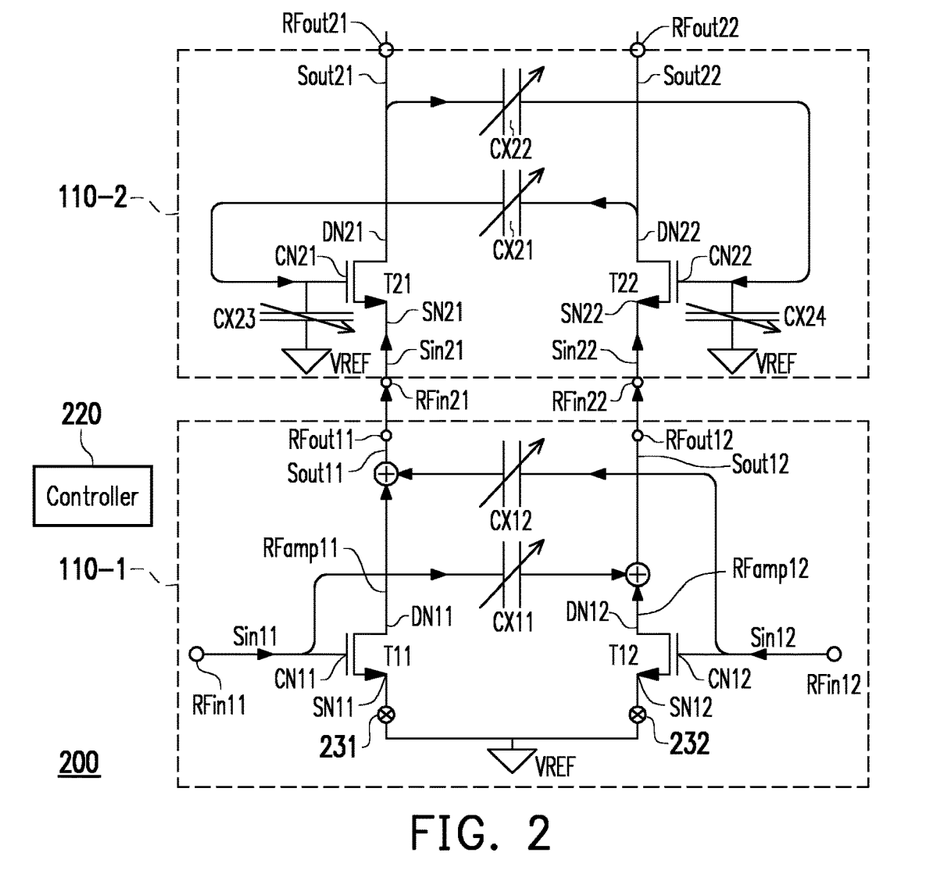
FIG. 2 is a circuit diagram of an amplifier device according to a second embodiment of the disclosure.

FIG. 2 is a circuit diagram of an amplifier device 200 according to a second embodiment of the disclosure. The main difference between the first embodiment (FIG. 1) and the second embodiment (FIG. 2) is that, in addition to the first-stage differential amplifier circuit (differential amplifier circuit 110-1), FIG. 2 further includes a second-stage differential amplifier circuit (i.e., differential amplifier circuit 110-2). Similar to the circuit structure of the differential amplifier circuit 110-1, the differential amplifier circuit 110-2 includes radio frequency input terminals RFin21 and RFin22, transistors T21 and T22, adjustable capacitor circuits CX21 and CX22, and radio frequency output terminals RFout21 and RFout22. That is, the amplifier device 200 has two stages of differential amplifier circuits.

The radio frequency input terminal RFin21 is coupled to the radio frequency output terminal RFout11 of the differential amplifier circuit 110-1 for inputting the radio frequency input signal Sin21 (i.e., the radio frequency output signal Sout11 of the differential amplifier circuit 110-1). The radio frequency input terminal RFin22 is coupled to the radio frequency output terminal RFout12 of the differential amplifier circuit 110-1 for inputting the radio frequency input signal Sin22 (i.e., the radio frequency output signal Sout12 of the differential amplifier circuit 110-1). The transistor T21 has a first terminal DN21, a second terminal SN21 and a control terminal CN21, and the second terminal SN21 is coupled to the radio frequency input terminal RFin21. The transistor T22 has a first terminal DN22, a second terminal SN22 and a control terminal CN22, and the second terminal SN22 is coupled to the radio frequency input terminal RFin22. The adjustable capacitor circuit CX21 is coupled between the control terminal CN21 of the transistor T21 and the first terminal DN22 of the transistor T22. The adjustable capacitor circuit CX22 is coupled between the control terminal CN22 of the transistor T22 and the first terminal DN21 of the transistor T21. The radio frequency output terminal RFout21 is coupled to the first terminal DN21 of the transistor T21 for outputting the radio frequency output signal Sout21. The radio frequency output terminal RFout22 is coupled to the first terminal DN22 of the transistor T22 for outputting the radio frequency output signal Sout22.

In addition to having the original functions of the controller 120 in FIG. 1, the controller 220 could further be coupled to the adjustable capacitor circuits CX21 and CX22 of the differential amplifier circuit 110-2. The controller 220 is further configured to adjust the capacitance values of the adjustable capacitor circuits CX21 and CX22 of the differential amplifier circuit 110-2 according to at least one of the characteristic related to the radio frequency input signal Sin21 of the differential amplifier circuit 110-2, the characteristic related to the radio frequency input signal Sin22, the matching deviation between the transistors T21 and T22 of the differential amplifier circuit 110-2, and the characteristic of the amplifier device 200.

For example, the characteristic related to the radio frequency input signal Sin21 may be the power of the radio frequency input signal Sin21 or the power of the radio frequency output signal Sout21. The characteristic related to the radio frequency input signal Sin22 may be the power of the radio frequency input signal Sin22 or the power of the radio frequency output signal Sout22.

For example, the characteristic of the amplifier device may be the signal amplification linearity of the amplifier device 200. The controller 220 is configured to adjust the capacitance values of the adjustable capacitor circuit CX21 of the differential amplifier circuit 110-2 and the adjustable capacitor circuit CX22 of the differential amplifier circuit 110-2 according to the characteristic related to the radio frequency input signal Sin21 or the characteristic related to the radio frequency input signal Sin22. Moreover, the controller 220 is configured to adjust the capacitance values of the adjustable capacitor circuits CX11 and CX12 of the differential amplifier circuit 110-1 according to the characteristic of the amplifier device 200.

The differential amplifier circuit 110-2 may further selectively include adjustable capacitor circuits CX23 and CX24. The adjustable capacitor circuit CX23 is coupled between the control terminal CN21 of the transistor T21 and the reference voltage terminal (for example, VREF). The adjustable capacitor circuit CX24 is coupled between the control terminal CN22 of the transistor T22 and the reference voltage terminal (for example, VREF).

The controller 220 is further coupled to the adjustable capacitor circuits CX23 and CX24 of the differential amplifier circuit 110-2. The controller 220 is further configured to adjust the capacitance values of the adjustable capacitor circuits CX23 and CX24 of the differential amplifier circuit 110-2 according to at least one of the characteristic related to the radio frequency input signal RFin21 of the differential amplifier circuit 110-2, the characteristic related to the radio frequency input signal RFin22 of the differential amplifier circuit 110-2, the matching deviation between the transistors T21 and T22 of the differential amplifier circuit 110-2 and the characteristic of the amplifier device 200.

The differential amplifier circuits 110-1 to 110-2 of this embodiment could respectively adjust the adjustable capacitor circuit for different purposes. For example, the adjustable capacitor circuits CX11 and CX12 in the differential amplifier circuit 110-1 could be configured to adjust the overall power gain of the amplifier circuit 200; the adjustable capacitor circuits CX21 and CX22 in the differential amplifier circuit 110-2 could be configured to adjust the linearity of the amplifier circuit 200. Those applying this embodiment could adopt the controller 220 to adjust the capacitance value of the adjustable capacitor circuit in the differential amplifier circuits 110-1 to 110-2 according to their needs for different purposes.

In order to reduce the adverse effects caused by the parasitic capacitance to ground of the transistors T11 and T12, the second terminals SN11 and SN12 of the transistors T11 and T12 in the differential amplifier circuit 110-1 of this embodiment could be coupled to the reference voltage terminal VREF through wafer vias 231 and 232 respectively, as shown in FIG. 1 and FIG. 2.

Figure 3:
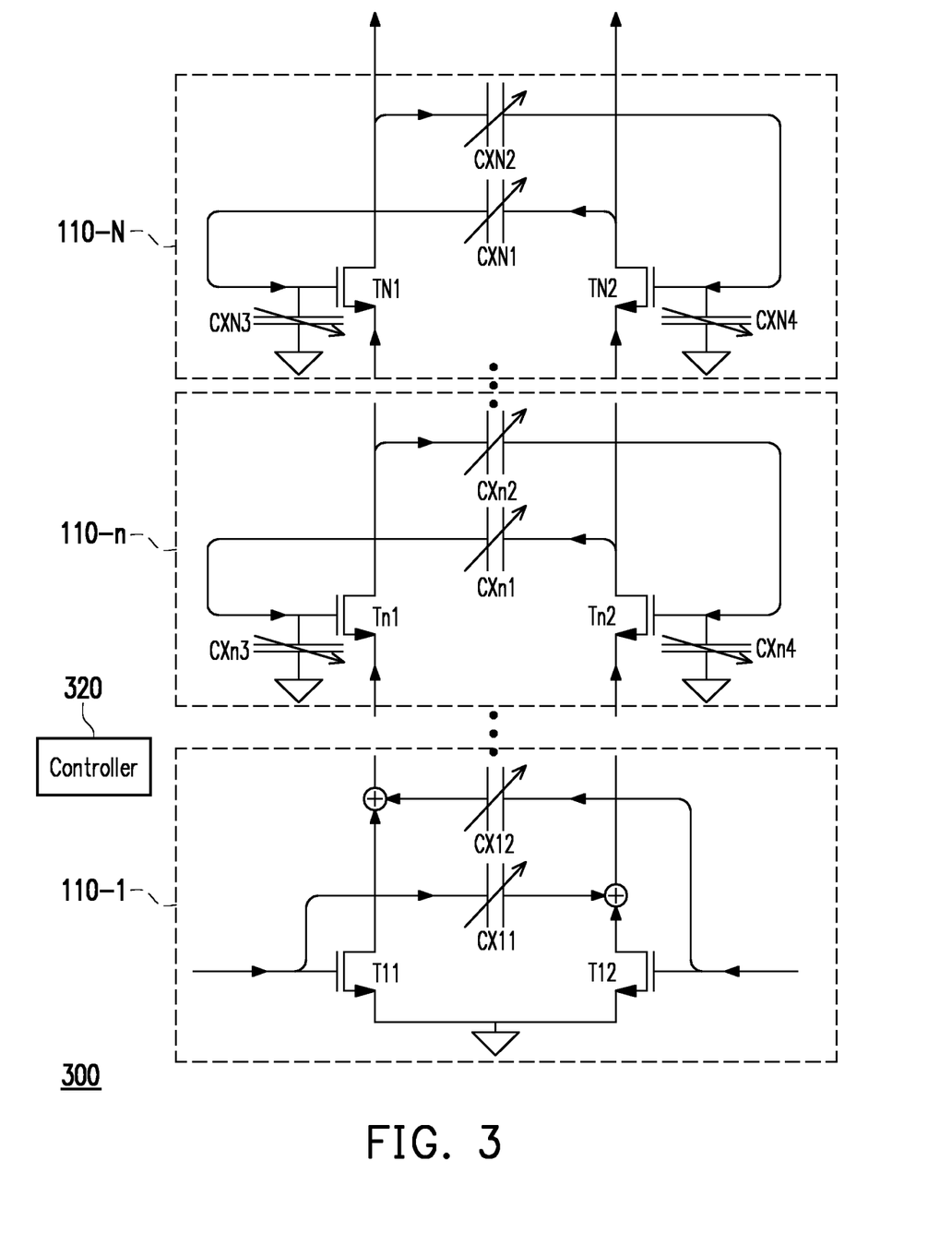
FIG. 3 is a circuit diagram of an amplifier device according to a third embodiment of the disclosure.

FIG. 3 is a circuit diagram of an amplifier device 300 according to a third embodiment of the disclosure. The main difference between the second embodiment (FIG. 2) and the third embodiment (FIG. 3) is that, in addition to the first-stage differential amplifier circuit (differential amplifier circuit 110-1), FIG. 3 further includes a multi-stage differential amplifier circuit, for example, further includes an n-th stage differential amplifier circuit (i.e., the differential amplifier circuit 110-$n$) and the N-th stage differential amplifier circuit (i.e., the differential amplifier circuit 110-N) as the last stage. In this embodiment, N is a positive integer greater than or equal to 3, n is a positive integer greater than or equal to 2, and n is less than or equal to N. The circuit structure of the differential amplifier circuit 110-$n$ and the differential amplifier circuit 110-N in FIG. 3 are the same as the circuit structure of the differential amplifier circuit 110-2 in FIG. 2, and no further repetition will be incorporated herein. When N is equal to 2, the amplifier device 300 has substantially the same circuit structure as that of the amplifier device 200 in FIG. 2.

The first and second radio frequency input terminals of the n-th differential amplifier circuit 110-$n$ are respectively coupled to the first and second radio frequency output terminals of the n−1th differential amplifier circuit 110-($n$−1). The controller 320 is further coupled to the adjustable capacitor circuits CX(n−1)1 and CX(n−1)2 of the n−1th differential amplifier circuit 110-($n$−1). The controller 320 is further configured to adjust the capacitance values of the adjustable capacitor circuits CX(n−1)1 and CX(n−1)2 of the n−1th differential amplifier circuit 110-($n$−1) according to at least one of the characteristic related to the first radio frequency input signal of the n−1th differential amplifier circuit, the characteristic related to the second radio frequency input signal of the n−1th differential amplifier circuit, the matching deviation between the transistors T(n−1)1 and T(n−1)2 of the n−1th differential amplifier circuit, and the characteristic of the amplifier device 300.

For example, the controller 320 is configured to adjust the capacitance values of the adjustable capacitor circuits CXn1 and CXn2 of the n-th differential amplifier circuit according to the signal amplification linearity of the amplifier device 300.

The differential amplifier circuits 110-1 to 110-N of different stages in the embodiment could respectively adjust the adjustable capacitor circuits of the differential amplifier circuits of different stages depending on different purposes. For example, assuming that the amplifier circuit 300 has a fourth-stage differential amplifier circuit (i.e., N=4), the first-stage differential amplifier circuit 110-1 could be configured to adjust the overall power gain of the amplifier circuit 300; the second-stage differential amplifier circuit 110-2 could be configured to adjust the reliability of the radio frequency signal of the amplifier circuit 300; the third-stage differential amplifier circuit 110-3 could be configured to adjust the DC power stability of the amplifier circuit 300; the fourth-stage differential amplifier circuit 110-4 could be configured to adjust the linearity of the amplifier circuit 300. Those applying this embodiment could adjust the capacitance values of the adjustable capacitor circuits in different stages of differential amplifier circuits according to their needs depending on different purposes.

Figure 4:
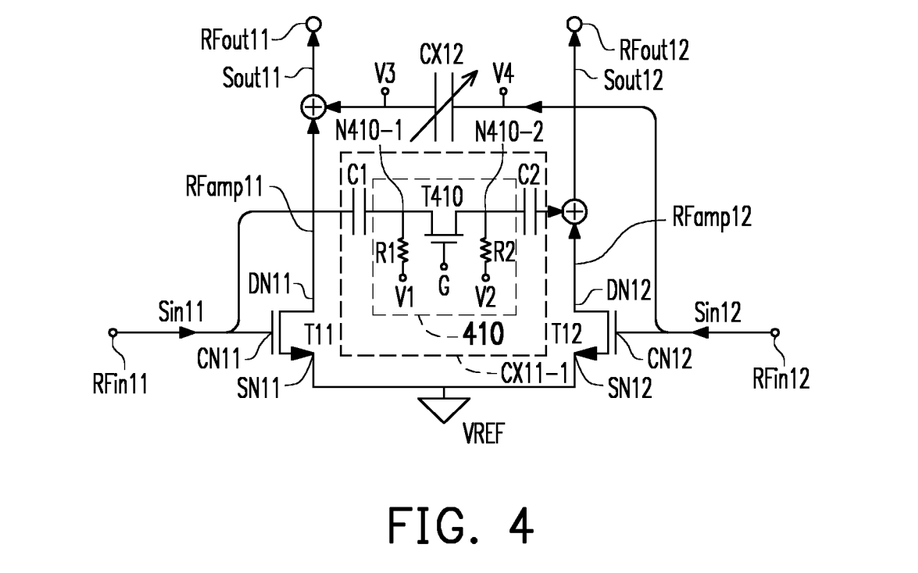
FIG. 4 shows a first circuit structure diagram of the adjustable capacitor circuit in various embodiments of the disclosure.

FIG. 4 shows a first circuit structure diagram of the adjustable capacitor circuit CX11-1 in various embodiments of the disclosure. The adjustable capacitor circuits in the foregoing embodiments (e.g., adjustable capacitor circuits CX11~CXN1, CX12~CXN2, CXn3, CX4) could be implemented through the adjustable capacitor circuit CX11-1 described in FIG. 4. The adjustable capacitor circuit CX11-1 in FIG. 4 mainly includes a capacitor C1, a capacitive coupling switch 410, and a capacitor C2. The first terminal of the capacitor C1 is coupled to one terminal of the adjustable capacitor circuit CX11-1 (e.g., coupled to the control terminal CN11 of the transistor T11). The second terminal of the capacitor C1 is coupled to the first terminal N410-1 of the capacitive coupling switch 410. The capacitive coupling switch 410 is controlled by a controller (for example, the controller 120 in FIG. 1) to change its on state or its off capacitance. The first terminal of the capacitor C2 is coupled to the second terminal N410-2 of the capacitive coupling switch 410.

The capacitive coupling switch 410 may include a transistor T410, and the control terminal G of which is controlled by a controller. In this embodiment, when the transistor T410 in the capacitive coupling switch 410 is controlled by the controller to cut off both terminals, the sum of the capacitance values of the capacitor C1, the off capacitor Coff provided in the capacitive coupling switch 410 and the capacitor C2 is provided between the control terminal CN11 of the transistor T11 and the first terminal DN12 of the transistor T12. When the transistor T410 in the capacitive coupling switch 410 is controlled by the controller to make its two terminals conductive, the sum of the capacitance values of the capacitor C1 and the capacitor C2 is provided between the control terminal CN11 of the transistor T11 and the first terminal DN12 of the transistor T12. In addition, the controller could change the capacitance value of the off capacitor Coff provided in the capacitive coupling switch 410 by controlling the voltage value on the control terminal G. The equivalent capacitance value of the adjustable capacitor circuit CX11-1 could be controlled digitally or analogously. For example, the transistor T410 in the capacitive coupling switch 410 could be digitally controlled by the controller to turn on or off both terminals, and the transistor T410 in the capacitive coupling switch 410 could be analogously controlled by the controller to change the voltage value on the control terminal G, thereby continuously changing the capacitance value of the off capacitor Coff provided in the capacitive coupling switch 410. In other embodiments of the disclosure, the capacitor C1 and the capacitor C2 may also be omitted.

The capacitive coupling switch 410 in FIG. 4 may also include control voltage terminals V1 and V2 and resistors R1 and R2 respectively coupled to the control voltage terminals V1 and V2. The control voltage terminal V1 is connected to the first terminal of the transistor T410 in the capacitive coupling switch 410 through the resistor R1, and the control voltage terminal V2 is connected to the second terminal of the transistor T410 in the capacitive coupling switch 410 through the resistor R2. In this manner, the controller of this embodiment not only could change the capacitance value of the off capacitor Coff provided in the capacitive coupling switch 410 by controlling the voltage value on the control terminal G, but also could change the capacitance value of the off capacitor Coff provided in the capacitive coupling switch 410 by adjusting the voltage on the control voltage terminals V1 and V2.

The capacitive coupling switch 410 may also automatically adjusted to be turned on or off without being controlled by the controller. For example, when the power of the radio frequency output signal Sout11 or Sout12 is higher than the preset power value, the capacitive coupling switch 410 would be automatically turned on or controlled by the controller to turn on; when the power of the radio frequency output signal Sout11 or Sout12 is lower than the preset power value, the capacitive coupling switch 410 would be automatically turned off or controlled by the controller to turn off.

In this embodiment, the voltage value in the adjustable capacitor circuit CX11-1 could also be adjusted through the voltages V1 and V2. The adjustment here could be made by using logic circuits or other automatic control technologies without adopting the controller, and the voltages V1 and V2 could be adopted to realize automatically adjusting the voltage value in the adjustable capacitor circuit. For example, the voltages V1 and V2 in FIG. 4 could be adopted to adjust the voltage value in the adjustable capacitor circuit CX11-1, and the voltages V3 and V4 could be adopted to adjust the voltage value in the adjustable capacitor circuit CX12. In this way, the design of this embodiment makes it possible that the voltage value of voltage V1 is related to the radio frequency input signal Sin11, the voltage value of voltage V2 is related to the radio frequency output signal Sout12, the voltage value of voltage V3 is related to the radio frequency input signal Sin12, and the voltage value of voltage V4 is related to the radio frequency output signal Sout11, so that the differential amplifier circuit can utilize V1 to V4 to adjust the voltage value in the adjustable capacitor circuits CX11-1 and CX12. The adjustable capacitor circuit CX12 could also be implemented by using a circuit structure that is the same as or similar to the adjustable capacitor circuit CX11-1.

Figure 5:
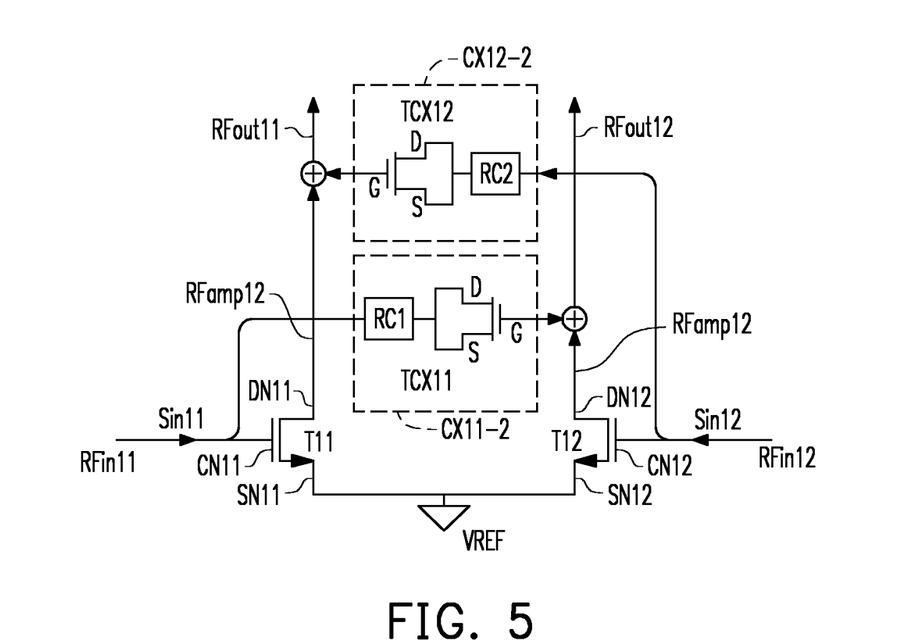
FIG. 5 shows a second circuit structure diagram of the adjustable capacitor circuit in various embodiments of the disclosure.

FIG. 5 shows a second circuit structure diagram of the adjustable capacitor circuits CX11-2 and CX12-2 in various embodiments of the disclosure. The adjustable capacitor circuits in the foregoing embodiments (e.g., adjustable capacitor circuits CX11~CXN1, CX12~CXN2, CXn3, CX4) could be implemented through the adjustable capacitor circuits CX11-2 and CX12-2 described in FIG. 5. The adjustable capacitor circuit CX11-2 in FIG. 5 mainly includes a capacitor transistor TCX11. The control terminal (e.g., gate terminal G) of the transistor TCX11 serves as one of the first terminal and the second terminal of the adjustable capacitor circuit CX11-2, for example, the first terminal. The first terminal (for example, the source terminal S) and the second terminal (for example, the drain terminal D) of the transistor TCX11 are connected to each other to serve as the other of the first terminal and the second terminal of the adjustable capacitor circuit CX11-2, for example, the second terminal, and is further connected to the radio frequency input terminal RFin11. In this way, the transistor TCX11 could be regarded as a diode with capacitance. The radio frequency input signal Sin11 in the radio frequency input terminal RFin11 could be coupled to the first terminal DN12 of the transistor T12 through the transistor TCX11. The adjustable capacitor circuit CX11-2 also includes a resistor capacitor circuit RC1, which is coupled between the first terminal (source terminal S) of the capacitor transistor TCX11 and the second terminal of the adjustable capacitor circuit CX11-2 to increase the bandwidth. The resistor capacitor circuit RC1 includes, for example, a resistor and a capacitor connected in series with each other.

The adjustable capacitor circuit CX12-2 of FIG. 5 mainly includes a transistor TCX12, the gate terminal G of the transistor TCX12 is connected to the first terminal DN11 of the transistor T11, and the source terminal S and the drain terminal D of the transistor TCX12 are connected to each other, and are further connected to the radio frequency input terminal RFin12. In this way, the transistor TCX12 could be regarded as a diode with capacitance. The radio frequency input signal Sin12 in the radio frequency input terminal RFin12 could be coupled to the first terminal DN11 of the transistor T11 through the transistor TCX12. The adjustable capacitor circuit CX12-2 also includes a resistor capacitor circuit RC2, which is coupled between the first terminal (source terminal S) of the capacitor transistor TCX12 and the second terminal of the adjustable capacitor circuit CX12-2 to increase the bandwidth. In this embodiment, by changing the voltage difference between the two terminals of the capacitor transistors TCX11 and TCX12, the capacitance values of the capacitor transistors TCX11 and TCX12 could be changed accordingly.

Those applying this embodiment could also replace the capacitor transistors TCX11 and TCX12 in FIG. 5 with appropriate diodes. The first terminal of the diode is used as the first terminal of the adjustable capacitor circuits CX11-2 and TCX12-2, and the second terminal of the diode is used as the second terminal of the adjustable capacitor circuits CX11-2 and TCX12-2. In other embodiments, the diode may also include a transistor connected in the form of a diode.

Figure 6:
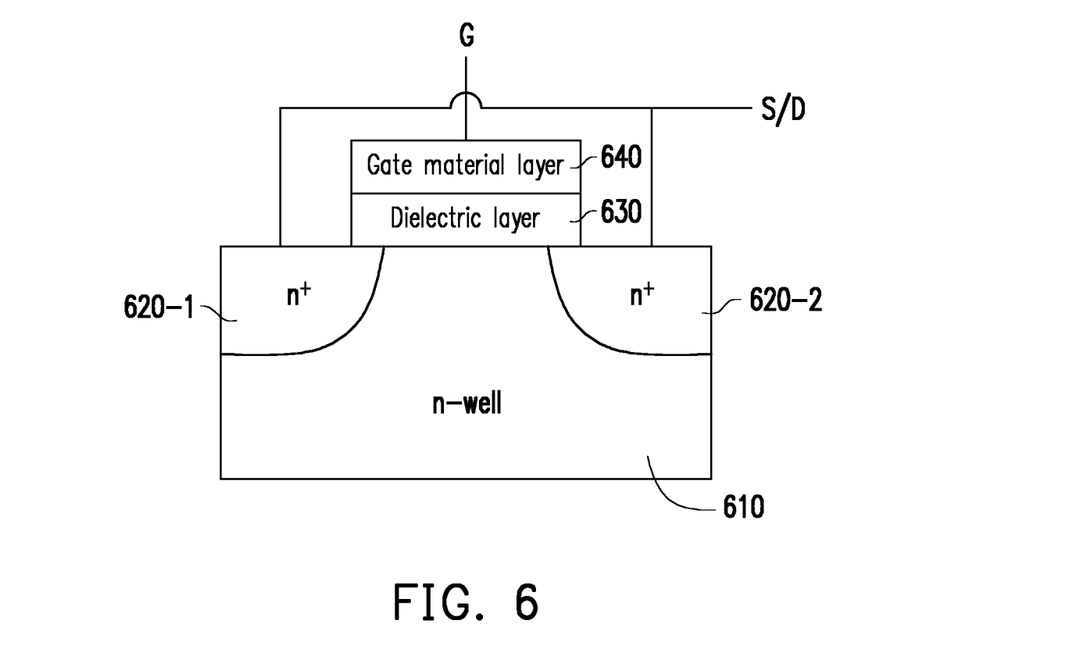
FIG. 6 is a schematic cross-sectional view of a capacitor transistor TCX in an embodiment of the disclosure.

FIG. 6 is a schematic cross-sectional view of a capacitor transistor TCX in an embodiment of the disclosure. The adjustable capacitor circuit (e.g., adjustable capacitor circuit CX11~CXN1, CX12~CXN2, CXn3, CX4) in various embodiments of the disclosure could be implemented by the capacitor transistor TCX described in FIG. 6. The capacitor transistor TCX in FIG. 6 mainly includes a well region 610, two heavily doped regions 620-1 and 620-2 forming a source terminal S and a drain terminal D, a dielectric layer 630, and a gate material layer 640. The dielectric layer 630 is disposed on the well region 610, and the dielectric layer 630 connects the two heavily doped regions 620-1 and 620-2. The gate material layer 640 is configured to form the gate terminal G and is disposed on the dielectric layer 630. The source terminal S and the drain terminal D are connected to each other. In this embodiment, the well region 610 may be a first-type well region, such as n-well; the heavily doped regions 620-1 and 620-2 may be a first-type heavily doped region, such as n+; the dielectric layer 630 may be a gate oxide layer; the gate material layer 640 is, for example, a poly gate. The first-type well region 610 and the heavily doped regions 620-1 and 620-2 may also be p-well and p+, respectively. In this embodiment, since the well region 610 and the heavily doped regions 620-1 and 620-2 are all made of the same type of material, as compared with the embodiment where the well region 610 and the heavily doped regions 620-1 and 620-2 are made of different types of materials, the capacitor transistor TCX can provide a better capacitance tuning range. For example, when the voltage difference at both terminals (source terminal S/drain terminal D and gate terminal G) of the capacitor transistor TCX fluctuates by 0.5V, other embodiments in which the well region and the heavily doped region are made of different types of materials only provide a capacitance turning range of about 0.1 pF. However, in the present embodiment where the well region and the heavily doped region are made of the same type of material could provide a capacitance turning range of about 2.8 pF.

Figure 7:
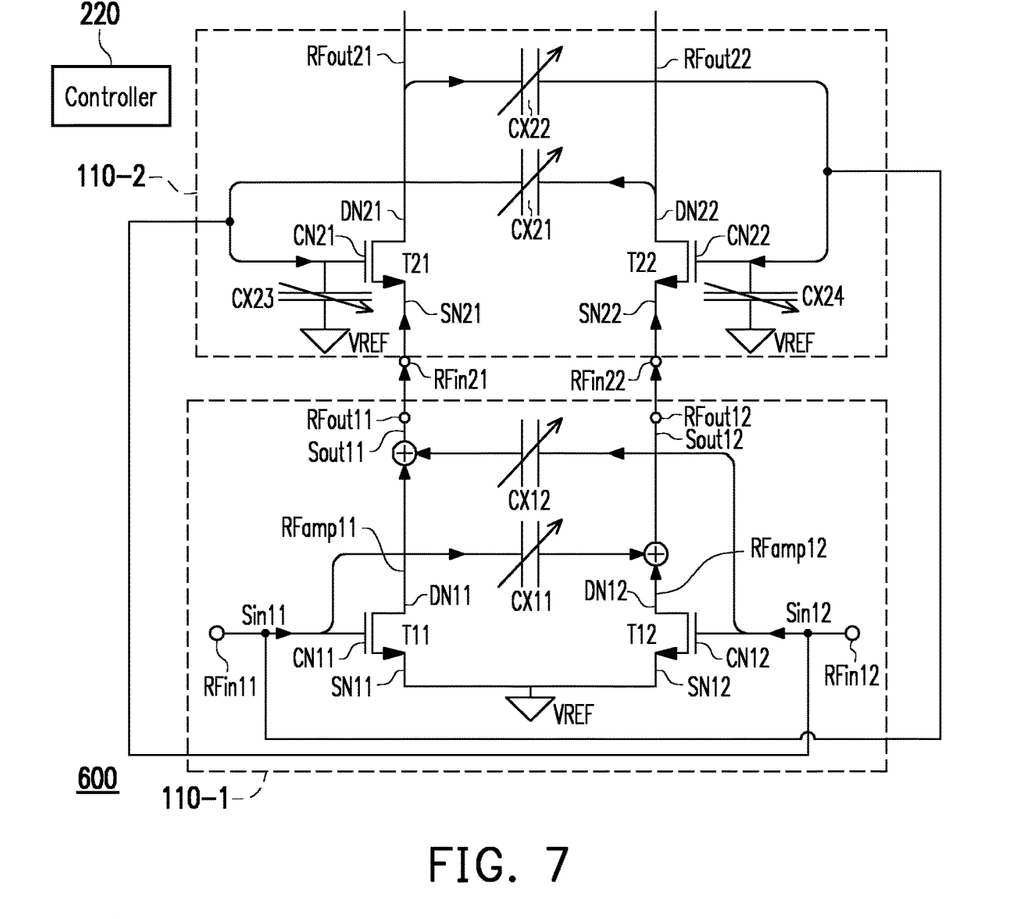
FIG. 7 is a circuit diagram of an amplifier device according to a fourth embodiment of the disclosure.

FIG. 7 is a circuit diagram of an amplifier device 600 according to a fourth embodiment of the disclosure. The amplifier device 600 of the fourth embodiment is similar to the amplifier device 200 of the second embodiment in FIG. 2, except that the control terminal CN21 of the transistor T21 of the differential amplifier circuit 110-2 in FIG. 7 is further coupled to the control terminal CN12 of the transistor T12 of the differential amplifier circuit 110-1, and the control terminal CN22 of the transistor T22 of the differential amplifier circuit 110-2 are also coupled to the control terminal CN11 of the transistor T11 of the differential amplifier circuit 110-1. In this way, the signal amplified and output by the first terminal DN22 of the transistor T22 of the differential amplifier circuit 110-2 could be fed back to the control terminal CN12 of the transistor T12 of the differential amplifier circuit 110-1, and the signal amplified and output by the first terminal DN21 of the transistor T21 of the differential amplifier circuit 110-2 could also be fed back to the control terminal CN11 of the transistor T11 of the differential amplifier circuit 110-1, to increase the signal amplification linearity of the amplifier device 600.

Figure 8:
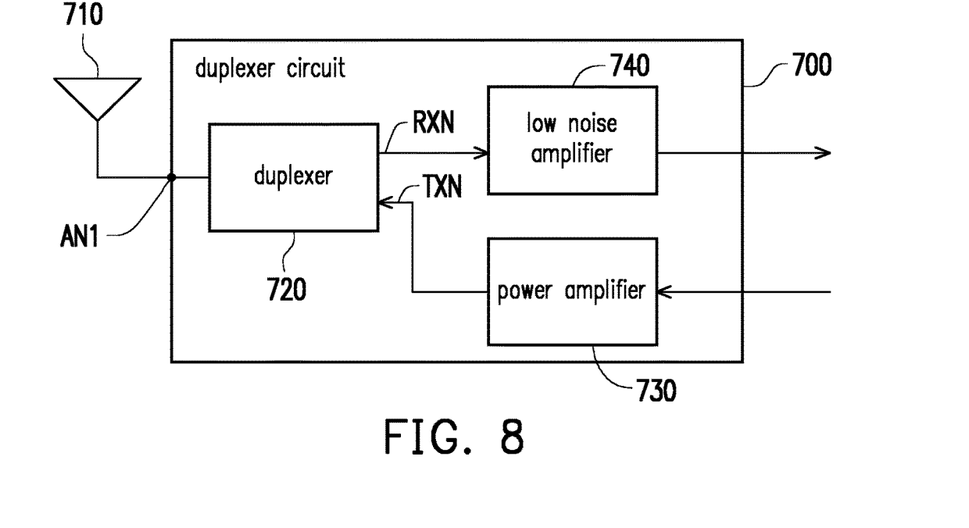
FIG. 8 shows a block diagram of a duplexer circuit in various embodiments of the disclosure.

FIG. 8 shows a block diagram of a duplexer circuit 700 in various embodiments of the disclosure. The duplexer circuit 700 is coupled to the antenna 710. The duplexer circuit 700 includes a duplexer 720, a power amplifier 730, and a low noise amplifier 740. The duplexer 720 includes an antenna terminal AN1, a signal transmitting terminal TXN, and a signal receiving terminal RXN. The power amplifier 730 is coupled to the signal transmitting terminal TXN of the duplexer 720. The low noise amplifier 740 is coupled to the signal receiving terminal RXN of the duplexer 720. The amplifier devices 100, 200, 300 and 600 described in the foregoing first to fourth embodiments may be configured in the power amplifier 730 or the low noise amplifier 740. Specifically, the amplifier devices 200, 300, and 600 with multi-stage differential amplifier circuits are more suitable to be configured in the low noise amplifier 740; the amplifier device 100 is more suitable to be configured in the power amplifier 730 or the low noise amplifier 740. The detailed circuit structure and actuation mode of the amplifier devices 100, 200, 300, and 600 are described in the foregoing embodiments.

In summary, the amplifier device and the duplexer circuit in the embodiment of the disclosure are realized by using differential amplifier circuits of one or more stages collaborated with the adjustable capacitor circuits in the differential amplifier circuits of different stages, and by adaptively adjusting the capacitance values in the adjustable capacitor circuits, the amplifier device and the duplexer circuit could have better power gain, better signal conversion efficiency, higher reliability, increased production yield rate and lower cost. With multi-stage differential amplifier circuits, it is also possible to adjust the adjustable capacitor circuits in the differential amplifier circuits of different stages respectively depending on different purposes (such as power gain, gain linearity, matching deviation of differential pair, second-order intercept point (IIP2), etc.). The components of the aforementioned amplifier device and the duplexer circuit could further be made of group III-V compound as materials to enhance the performance of the amplifier device through the material.

What is claimed is:

1. An amplifier device, comprising:
a first differential amplifier circuit, comprising:
a first radio frequency input terminal, for inputting a first radio frequency input signal;
a second radio frequency input terminal, for inputting a second radio frequency input signal;
a first transistor, having a first terminal and a control terminal coupled to the first radio frequency input terminal, wherein the control terminal obtains the first radio frequency input signal through the first radio frequency input terminal, the first transistor amplifies the first radio frequency input signal and generates a first amplified radio frequency signal at the first terminal;
a second transistor, having a first terminal and a control terminal coupled to the second radio frequency input terminal, wherein the control terminal obtains the second radio frequency input signal through the second radio frequency input terminal, the second transistor amplifies the second radio frequency input signal and generates a second amplified radio frequency signal at the first terminal;
a first adjustable capacitor circuit, coupled between the control terminal of the first transistor and the first terminal of the second transistor, for coupling the first radio frequency input signal to the first terminal of the second transistor; and
a second adjustable capacitor circuit, coupled between the control terminal of the second transistor and the first terminal of the first transistor, for coupling the second radio frequency input signal to the first terminal of the first transistor;
a first radio frequency output terminal, coupled to the first terminal of the first transistor, for outputting a first radio frequency output signal; and
a second radio frequency output terminal, coupled to the first terminal of the second transistor, for outputting a second radio frequency output signal,
wherein the first amplified radio frequency signal is combined with the coupled second radio frequency input signal to form the first radio frequency output signal, and the second amplified radio frequency signal is combined with the coupled first radio frequency input signal to form the second radio frequency output signal; and
a controller, coupled to the first adjustable capacitor circuit of the first differential amplifier circuit and the second adjustable capacitor circuit of the first differential amplifier circuit, configured to adjust capacitance values of the first adjustable capacitor circuit of the first differential amplifier circuit and the second adjustable capacitor circuit of the first differential amplifier circuit according to at least one of a characteristic related to the first radio frequency input signal of the first differential amplifier circuit, a characteristic related to the second radio frequency input signal of the first differential amplifier circuit, a matching deviation between the first transistor and the second transistor of the first differential amplifier circuit, and a characteristic of the amplifier device.

2. The amplifier device according to claim 1, wherein the characteristic of the amplifier device is a signal amplification linearity of the amplifier device, and the controller adjusts the capacitance values in the first adjustable capacitor circuit and in the second adjustable capacitor circuit according to a second-order intercept point related to the signal amplification linearity of the amplifier device.

3. The amplifier device according to claim 1, wherein the characteristic of the amplifier device comprises an operating current of the amplifier device and a gain of the amplifier device.

4. The amplifier device according to claim 1, wherein the characteristic related to the first radio frequency input signal is a frequency of the first radio frequency input signal, a frequency of the first radio frequency output signal, a power of the first radio frequency input signal, or a power of the first radio frequency output signal, and the characteristic related to the second radio frequency input signal is a frequency of the second radio frequency input signal, a frequency of the second radio frequency output signal, a power of the second radio frequency input signal, or a power of the second radio frequency output signal.

5. The amplifier device according to claim 1, wherein various components in the amplifier device are made of group III-V compound as material.

6. The amplifier device according to claim 1, further comprising:
   a second differential amplifier circuit, comprising:
      a first radio frequency input terminal, coupled to the first radio frequency output terminal of the first differential amplifier circuit, for inputting a first radio frequency input signal;
      a second radio frequency input terminal, coupled to the second radio frequency output terminal of the first differential amplifier circuit, for inputting a first radio frequency input signal;
      a first transistor, having a first terminal, a control terminal, and a second terminal coupled to the first radio frequency input terminal;
      a second transistor, having a first terminal, a control terminal, and a second terminal coupled to the second radio frequency input terminal;
      a first adjustable capacitor circuit, coupled between the control terminal of the first transistor and the first terminal of the second transistor;
      a second adjustable capacitor circuit, coupled between the control terminal of the second transistor and the first terminal of the first transistor;
      a first radio frequency output terminal, coupled to the first terminal of the first transistor, for outputting a first radio frequency output signal; and
      a second radio frequency output terminal, coupled to the first terminal of the second transistor, for outputting a second radio frequency output signal,
   wherein the controller is further coupled to the first adjustable capacitor circuit of the second differential amplifier circuit and the second adjustable capacitor circuit of the second differential amplifier circuit; the controller is further configured to adjust capacitance values of the first adjustable capacitor circuit of the second differential amplifier circuit and the second adjustable capacitor circuit of the second differential amplifier circuit according to at least one of a characteristic related to the first radio frequency input signal of the second differential amplifier circuit, a characteristic related to the second radio frequency input signal of the second differential amplifier circuit, a matching deviation between the first transistor and the second transistor of the second differential amplifier circuit, and the characteristic of the amplifier device.

7. The amplifier device according to claim 6, wherein the characteristic related to the first radio frequency input signal is a power of the first radio frequency input signal, or a power of the first radio frequency output signal, and the characteristic related to the second radio frequency input signal is a power of the second radio frequency input signal, or a power of the second radio frequency output signal, the characteristic of the amplifier device is a signal amplification linearity of the amplifier device;
   wherein the controller is configured for adjusting the capacitance values of the first adjustable capacitor circuit of the first differential amplifier circuit and the second adjustable capacitor circuit of the first differential amplifier circuit according to the characteristic related to the first radio frequency input signal or the characteristic related to the second radio frequency input signal, and the controller is configured to adjust the capacitance values of the first adjustable capacitor circuit of the second differential amplifier circuit and the second adjustable capacitor circuit of the second differential amplifier circuit according to the characteristic of the amplifier device.

8. The amplifier device according to claim 6, wherein the second differential amplifier circuit further comprises:
   a third adjustable capacitor circuit, coupled between the control terminal of the first transistor and a reference voltage terminal; and
   a fourth adjustable capacitor circuit, coupled between the control terminal of the second transistor and the reference voltage terminal;
   wherein the controller is further coupled to the third adjustable capacitor circuit of the second differential amplifier circuit and the fourth adjustable capacitor circuit of the second differential amplifier circuit, the controller is further configured to adjust capacitance values of the third adjustable capacitor circuit of the second differential amplifier circuit and the fourth adjustable capacitor circuit of the second differential amplifier circuit according to at least one of the characteristic related to the first radio frequency input signal of the second differential amplifier circuit, the characteristic related to the second radio frequency input signal of the second differential amplifier circuit, the matching deviation between the first transistor and the second transistor of the second differential amplifier circuit, and the characteristic of the amplifier device.

9. The amplifier device according to claim 6, wherein the control terminal of the first transistor of the second differential amplifier circuit is coupled to the control terminal of the second transistor of the first differential amplifier circuit, and the control terminal of the second transistor of the second differential amplifier circuit is coupled to the control terminal of the first transistor of the first differential amplifier circuit.

10. The amplifier device according to claim 1, wherein the second terminal of the first transistor of the first differential amplifier circuit is coupled to a reference voltage terminal through a first through wafer vias, and the second terminal of the second transistor of the first differential amplifier circuit is coupled to the reference voltage terminal through a second through wafer vias.

11. The amplifier device according to claim 1, wherein the first adjustable capacitor circuit and the second adjustable capacitor circuit respectively comprise at least one switch, and the at least one switch is configured to adjust the capacitance values in the first adjustable capacitor circuit and the second adjustable capacitor circuit;
   wherein the at least one switch is turned on when power of the first radio frequency output signal or power of the second radio frequency output signal is higher than a preset power value, and the at least one switch is turned off when the power of the first radio frequency output signal or the power of the second radio frequency output signal is lower than the preset power value.

12. The amplifier device according to claim 1, further comprising:
   N−1 differential amplifier circuits, N being a positive integer greater than 2, wherein each of the differential amplifier circuits comprises:
   a first radio frequency input terminal, for inputting a first radio frequency input signal;
   a second radio frequency input terminal, for inputting a second radio frequency input signal;
   a first transistor, having a first terminal, a control terminal, and a second terminal coupled to the first radio frequency input terminal;
   a second transistor, having a first terminal, a control terminal, and a second terminal coupled to the second radio frequency input terminal;

a first adjustable capacitor circuit, coupled between the control terminal of the first transistor and the first terminal of the second transistor;
a second adjustable capacitor circuit, coupled between the control terminal of the second transistor and the first terminal of the first transistor;
a first radio frequency output terminal, coupled to the first terminal of the first transistor, for outputting a first radio frequency output signal; and
a second radio frequency output terminal, coupled to the first terminal of the second transistor, for outputting a second radio frequency output signal;
wherein the first radio frequency input terminal of the n-th differential amplifier circuit is coupled to the first radio frequency output terminal of the n−1th differential amplifier circuit, and the second radio frequency input terminal of the n-th differential amplifier circuit is coupled to the second radio frequency output terminal of the n−1th differential amplifier circuit, the controller is further coupled to the first adjustable capacitor circuit of the n−1th differential amplifier circuit and the second adjustable capacitor circuit of the n−1th differential amplifier circuit, the controller is further configured to adjust capacitance values of the first adjustable capacitor circuit of the n−1th differential amplifier circuit and the second adjustable capacitor circuit of the n−1th differential amplifier circuit according to at least one of a characteristic related to the first radio frequency input signal of the n−1th differential amplifier circuit, a characteristic related to the second radio frequency input signal of the n−1th differential amplifier circuit, a matching deviation between the first transistor and the second transistor of the n−1th differential amplifier circuit, and the characteristic of the amplifier device, wherein n is a positive integer greater than or equal to 2 and n is less than or equal to N.

13. The amplifier device according to claim 12, wherein the controller is further configured for adjusting capacitance values of the first adjustable capacitor circuit of the n-th differential amplifier circuit and the second adjustable capacitor circuit of the n-th differential amplifier circuit according to a signal amplification linearity of the amplifier device.

14. The amplifier device according to claim 1, wherein:
the first adjustable capacitor circuit comprises:
a first capacitor, a first terminal of which is coupled to one terminal of the first adjustable capacitor circuit;
a capacitive coupling switch, controlled by the controller, to change an on-state or change an off capacitance of the capacitive coupling switch, a first terminal of which is coupled to a second terminal of the first capacitor; and
a second capacitor, a first terminal of which is coupled to a second terminal of the capacitive coupling switch, and a second terminal of the second capacitor is coupled to another terminal of the first adjustable capacitor circuit; or
the second adjustable capacitor circuit further comprises:
a first capacitor, a first terminal of which is coupled to one terminal of the second adjustable capacitor circuit;
a capacitive coupling switch, controlled by the controller, to change an on-state or change an off capacitance of the capacitive coupling switch, a first terminal of which is coupled to a second terminal of the first capacitor; and
a second capacitor, a first terminal of which is coupled to a second terminal of the capacitive coupling switch, and a second terminal of the second capacitor is coupled to another terminal of the second adjustable capacitor circuit.

15. An amplifier device, comprising:
a first differential amplifier circuit, comprising:
a first radio frequency input terminal, for inputting a first radio frequency input signal;
a second radio frequency input terminal, for inputting a second radio frequency input signal;
a first transistor, wherein a control terminal of which obtains the first radio frequency input signal through the first radio frequency input terminal, the first transistor amplifies the first radio frequency input signal and generates a first amplified radio frequency signal at a first terminal of the first transistor;
a second transistor, wherein a control terminal of which obtains the second radio frequency input signal through the second radio frequency input terminal, the second transistor amplifies the second radio frequency input signal and generates a second amplified radio frequency signal at a first terminal of the second transistor;
a first adjustable capacitor circuit, wherein a first terminal of which is coupled to the control terminal of the first transistor for receiving a first voltage, and a second terminal of which is coupled to the first terminal of the second transistor for receiving a second voltage, the first adjustable capacitor circuit is configured to couple the first radio frequency input signal to the first terminal of the second transistor, and a capacitance value of the first adjustable capacitor circuit is controlled by the first voltage and the second voltage; and
a second adjustable capacitor circuit, wherein a first terminal of which is coupled to the control terminal of the second transistor for receiving a third voltage, and a second terminal of which is coupled to the first terminal of the first transistor for receiving a fourth voltage, the second adjustable capacitor circuit is configured for coupling the second radio frequency input signal to the first terminal of the first transistor, and a capacitance value of the second adjustable capacitor circuit is controlled by the third voltage and the fourth voltage;
wherein the first amplified radio frequency signal is combined with the coupled second radio frequency input signal to form a first radio frequency output signal, and the second amplified radio frequency signal is combined with the coupled first radio frequency input signal to form a second radio frequency output signal;
wherein the first voltage is related to the first radio frequency input signal, the second voltage is related to the second radio frequency output signal, the third voltage is related to the second radio frequency input signal, and the fourth voltage is related to the first radio frequency output signal.

16. The amplifier device according to claim 15, wherein the first adjustable capacitor circuit or the second adjustable capacitor circuit comprises:
a capacitor transistor, wherein a control terminal of the capacitor transistor serves as one of a first terminal and a second terminal of the first adjustable capacitor circuit, and a first terminal and a second terminal of the capacitor transistor are connected to serve as the other of the first terminal and the second terminal of the first adjustable capacitor circuit;
wherein the capacitor transistor comprises:
a first-type well region;

two first-type heavily doped regions forming the first terminal and the second terminal of the capacitor transistor and arranged on the first-type well region;

a dielectric layer, connecting the two first-type heavily doped regions; and a gate material forming the control terminal of the capacitor transistor and arranged on the dielectric layer.

17. The amplifier device according to claim 16, wherein the first adjustable capacitor circuit or the second adjustable capacitor circuit further comprises:

a resistor capacitor circuit, coupled between the first terminal of the capacitor transistor and the second terminal of the first adjustable capacitor circuit.

18. A duplexer circuit, coupled to an antenna, the duplexer circuit comprising:

a duplexer, comprising an antenna terminal, a signal transmitting terminal and a signal receiving terminal;

a power amplifier, coupled to the signal transmitting terminal of the duplexer;

a low noise amplifier, coupled to the signal receiving terminal of the duplexer; and an amplifier device, arranged in the power amplifier or the low noise amplifier, the amplifier device comprising:

a first differential amplifier circuit, comprising:

a first radio frequency input terminal, for inputting a first radio frequency input signal;

a second radio frequency input terminal, for inputting a second radio frequency input signal;

a first transistor, having a first terminal and a control terminal coupled to the first radio frequency input terminal, wherein the control terminal obtains the first radio frequency input signal through the first radio frequency input terminal, the first transistor amplifies the first radio frequency input signal and generates a first amplified radio frequency signal at the first terminal;

a second transistor, having a first terminal and a control terminal coupled to the second radio frequency input terminal, wherein the control terminal obtains the second radio frequency input signal through the second radio frequency input terminal, the second transistor amplifies the second radio frequency input signal and generates a second amplified radio frequency signal at the first terminal;

a first adjustable capacitor circuit, coupled between the control terminal of the first transistor and the first terminal of the second transistor, for coupling the first radio frequency input signal to the first terminal of the second transistor; and a second adjustable capacitor circuit, coupled between the control terminal of the second transistor and the first terminal of the first transistor, for coupling the second radio frequency input signal to the first terminal of the first transistor;

a first radio frequency output terminal, coupled to the first terminal of the first transistor, for outputting a first radio frequency output signal; and a second radio frequency output terminal, coupled to the first terminal of the second transistor, for outputting a second radio frequency output signal, wherein the first amplified radio frequency signal is combined with the coupled second radio frequency input signal to form the first radio frequency output signal, and the second amplified radio frequency signal is combined with the coupled first radio frequency input signal to form the second radio frequency output signal; and a controller, coupled to the first adjustable capacitor circuit of the first differential amplifier circuit and the second adjustable capacitor circuit of the first differential amplifier circuit, configured to adjust capacitance values of the first adjustable capacitor circuit of the first differential amplifier circuit and the second adjustable capacitor circuit of the first differential amplifier circuit according to at least one of a characteristic related to the first radio frequency input signal of the first differential amplifier circuit, a characteristic related to the second radio frequency input signal of the first differential amplifier circuit, a matching deviation between the first transistor and the second transistor of the first differential amplifier circuit, and a characteristic of the amplifier device.

19. The duplexer circuit according to claim 18, wherein the amplifier device is configured in the low noise amplifier, the characteristic of the amplifier device is a signal amplification linearity of the amplifier device, and the controller adjusts the capacitance values of the first adjustable capacitor circuit and of the second adjustable capacitor circuit according to a second-order intercept point related to the signal amplification linearity of the amplifier device.

20. The duplexer circuit according to claim 18, wherein the amplifier device is configured in the power amplifier, and further comprising:

a second differential amplifier circuit, comprising:

a first radio frequency input terminal, coupled to the first radio frequency output terminal of the first differential amplifier circuit, for inputting a first radio frequency input signal;

a second radio frequency input terminal, coupled to the second radio frequency output terminal of the first differential amplifier circuit, for inputting a first radio frequency input signal;

a first transistor, having a first terminal, a control terminal, and a second terminal coupled to the first radio frequency input terminal;

a second transistor, having a first terminal, a control terminal, and a second terminal coupled to the second radio frequency input terminal;

a first adjustable capacitor circuit, coupled between the control terminal of the first transistor and the first terminal of the second transistor;

a second adjustable capacitor circuit, coupled between the control terminal of the second transistor and the first terminal of the first transistor;

a first radio frequency output terminal, coupled to the first terminal of the first transistor, for outputting a first radio frequency output signal; and a second radio frequency output terminal, coupled to the first terminal of the second transistor, for outputting a second radio frequency output signal, wherein the controller is further coupled to the first adjustable capacitor circuit of the second differential amplifier circuit and the second adjustable capacitor circuit of the second differential amplifier circuit, for adjusting capacitance values of the first adjustable capacitor circuit of the second differential amplifier circuit and of the second adjustable capacitor circuit of the second differential amplifier circuit.

* * * * *